(12) United States Patent
Liao et al.

(10) Patent No.: US 11,244,823 B2
(45) Date of Patent: Feb. 8, 2022

(54) VARYING TEMPERATURE ANNEAL FOR FILM AND STRUCTURES FORMED THEREBY

(71) Applicant: Taiwan Semiconductor Manufacturing Company, Ltd., Hsinchu (TW)

(72) Inventors: Shu Ling Liao, Taichung (TW); Chung-Chi Ko, Nantou (TW); Wan-Yi Kao, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/587,239

(22) Filed: Sep. 30, 2019

(65) Prior Publication Data

US 2020/0027719 A1   Jan. 23, 2020

Related U.S. Application Data

(62) Division of application No. 16/100,288, filed on Aug. 10, 2018, now Pat. No. 10,748,760.

(Continued)

(51) Int. Cl.
| | |
|---|---|
| *H01L 29/78* | (2006.01) |
| *H01L 21/02* | (2006.01) |
| *H01L 21/8234* | (2006.01) |
| *H01L 29/66* | (2006.01) |
| *H01L 27/088* | (2006.01) |

(52) U.S. Cl.
CPC ...... *H01L 21/0228* (2013.01); *H01L 21/0214* (2013.01); *H01L 21/0234* (2013.01); *H01L 21/02126* (2013.01); *H01L 21/02211* (2013.01); *H01L 21/02332* (2013.01); *H01L 21/02337* (2013.01); *H01L 21/823468* (2013.01); *H01L 29/6656* (2013.01); *H01L 29/66795* (2013.01); *H01L 29/785* (2013.01); *H01L 21/823431* (2013.01); *H01L 27/0886* (2013.01)

(58) Field of Classification Search
None
See application file for complete search history.

(56) References Cited

U.S. PATENT DOCUMENTS

| | | |
|---|---|---|
| 5,883,003 A | 3/1999 | Matsubara |
| 5,976,990 A | 11/1999 | Mercaldi et al. |

(Continued)

FOREIGN PATENT DOCUMENTS

| | | |
|---|---|---|
| KR | 950034626 A | 12/1995 |
| KR | 20170047096 A | 5/2017 |

(Continued)

*Primary Examiner* — Telly D Green
(74) *Attorney, Agent, or Firm* — Slater Matsil, LLP

(57) ABSTRACT

Semiconductor device structures having dielectric features and methods of forming dielectric features are described herein. In some examples, the dielectric features are formed by an ALD process followed by a varying temperature anneal process. The dielectric features can have high density, low carbon concentration, and lower k-value. The dielectric features formed according to the present disclosure has improved resistance against etching chemistry, plasma damage, and physical bombardment in subsequent processes while maintaining a lower k-value for target capacitance efficiency.

20 Claims, 17 Drawing Sheets

Related U.S. Application Data

(60) Provisional application No. 62/592,973, filed on Nov. 30, 2017.

(56) References Cited

U.S. PATENT DOCUMENTS

| | | | |
|---|---|---|---|
| 7,396,565 B2 | 7/2008 | Yang et al. | |
| 7,547,952 B2 | 6/2009 | Metzner et al. | |
| 7,659,158 B2 | 2/2010 | Ma et al. | |
| 8,282,992 B2 | 10/2012 | Myo et al. | |
| 8,491,967 B2 | 7/2013 | Ma et al. | |
| 8,703,624 B2 | 4/2014 | Yang et al. | |
| 8,877,599 B2 | 11/2014 | Fang et al. | |
| 9,418,890 B2 | 8/2016 | Ma et al. | |
| 9,685,533 B1 * | 6/2017 | Kuo | H01L 21/28088 |
| 9,916,980 B1 | 3/2018 | Knaepen et al. | |
| 10,249,530 B2 | 4/2019 | Wang et al. | |
| 10,510,852 B2 * | 12/2019 | Kao | H01L 29/41791 |
| 2003/0015762 A1 | 1/2003 | Lee et al. | |
| 2003/0188682 A1 | 10/2003 | Tois et al. | |
| 2008/0061379 A1 * | 3/2008 | Chen | H01L 29/7833 257/382 |
| 2009/0014885 A1 | 1/2009 | Chen et al. | |
| 2009/0033358 A1 | 2/2009 | Chen et al. | |
| 2009/0120924 A1 | 5/2009 | Moffatt et al. | |
| 2010/0304047 A1 | 12/2010 | Yang et al. | |
| 2012/0100681 A1 | 4/2012 | Fang et al. | |
| 2012/0299154 A1 | 11/2012 | Sim et al. | |
| 2013/0309829 A1 | 11/2013 | Fang et al. | |
| 2014/0158674 A1 | 6/2014 | Moffatt et al. | |
| 2014/0183706 A1 | 7/2014 | Yang et al. | |
| 2014/0287164 A1 | 9/2014 | Xiao et al. | |
| 2015/0221676 A1 * | 8/2015 | Holt | H01L 21/823431 257/347 |
| 2016/0068940 A1 | 3/2016 | Lass et al. | |
| 2016/0141381 A1 * | 5/2016 | Kim | H01L 29/785 257/288 |
| 2016/0233310 A1 * | 8/2016 | Lee | H01L 29/66545 |
| 2016/0372567 A1 * | 12/2016 | Tak | H01L 29/0847 |
| 2017/0110577 A1 | 4/2017 | Wang et al. | |
| 2017/0117140 A1 | 4/2017 | Tak et al. | |
| 2017/0133219 A1 | 5/2017 | Tak et al. | |
| 2017/0178927 A1 | 6/2017 | Biggs et al. | |
| 2017/0250253 A1 | 8/2017 | Toia et al. | |
| 2017/0358670 A1 | 12/2017 | Kub et al. | |
| 2019/0165112 A1 * | 5/2019 | Kao | H01L 21/823431 |
| 2019/0229012 A1 | 7/2019 | Wang et al. | |
| 2020/0019151 A1 * | 1/2020 | Davis | B01D 17/02 |

FOREIGN PATENT DOCUMENTS

| | | |
|---|---|---|
| KR | 20170053371 A | 5/2017 |
| TW | 200939477 A | 9/2009 |
| TW | 201543572 A | 11/2015 |

* cited by examiner

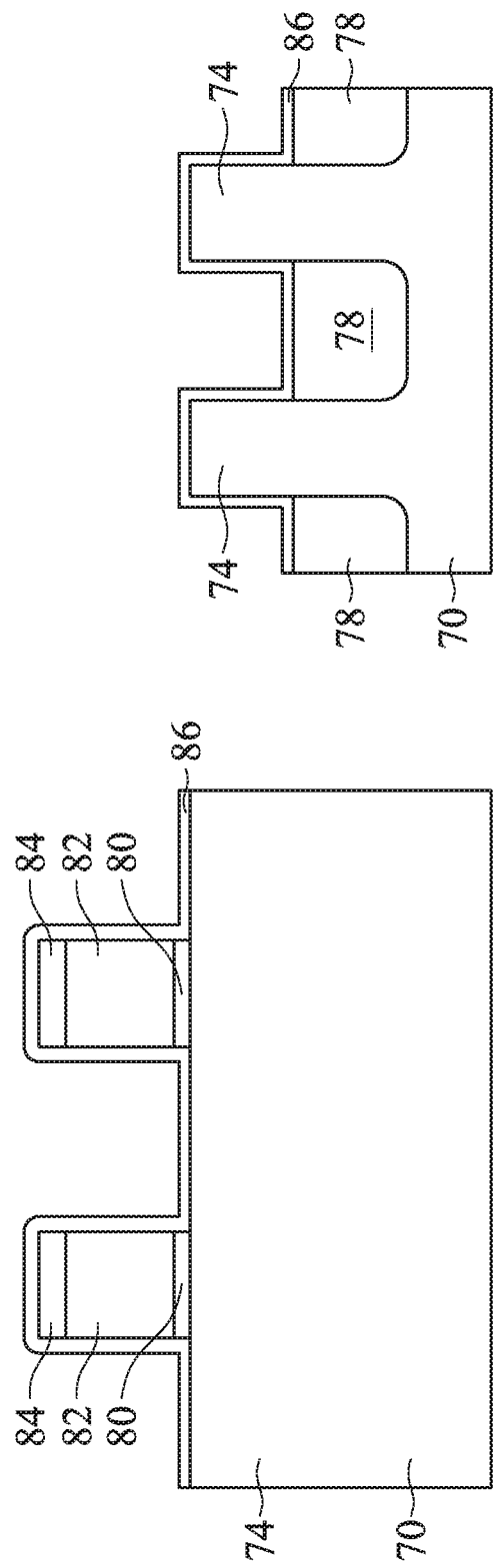

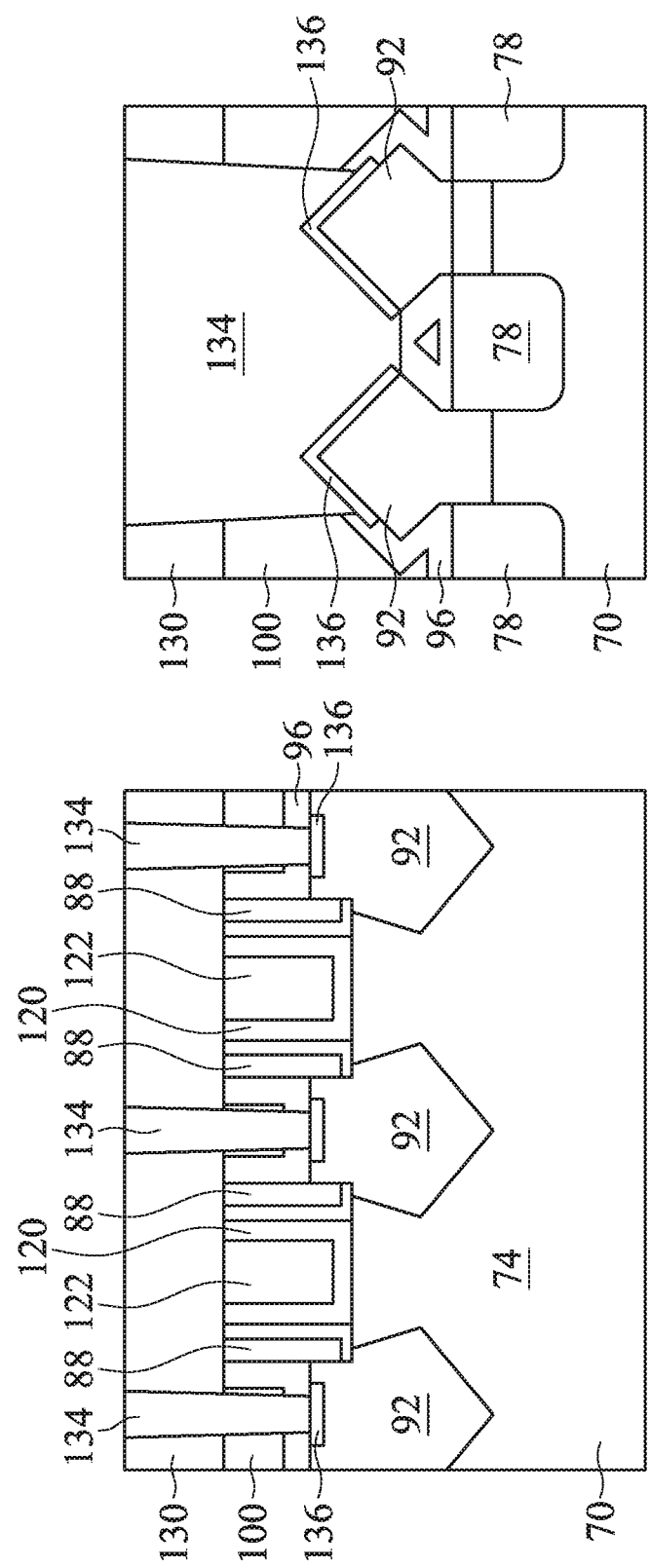

VARYING TEMPERATURE ANNEAL FOR FILM AND STRUCTURES FORMED THEREBY

PRIORITY CLAIM AND CROSS-REFERENCE

This application is a divisional of U.S. patent application Ser. No. 16/100,288, filed on Aug. 10, 2018, entitled "Varying Temperature Anneal for Film and Structures Formed Thereby," which claims the benefit of and priority to U.S. Provisional Patent Application No. 62/592,973, filed on Nov. 30, 2017, entitled "Varying Temperature Anneal for Film and Structures Formed Thereby," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-C, 2A-B, 3A-B, 4A-B, 5A-B, and 6A-B are various views of respective intermediate structures at intermediate stages in an example process of forming a semiconductor device in accordance with some embodiments.

FIGS. 7A-B and 8A-B are cross-sectional views of respective intermediate structures at intermediate stages in another example process of forming a semiconductor device in accordance with some embodiments.

DETAILED DESCRIPTION

Figure 1A:
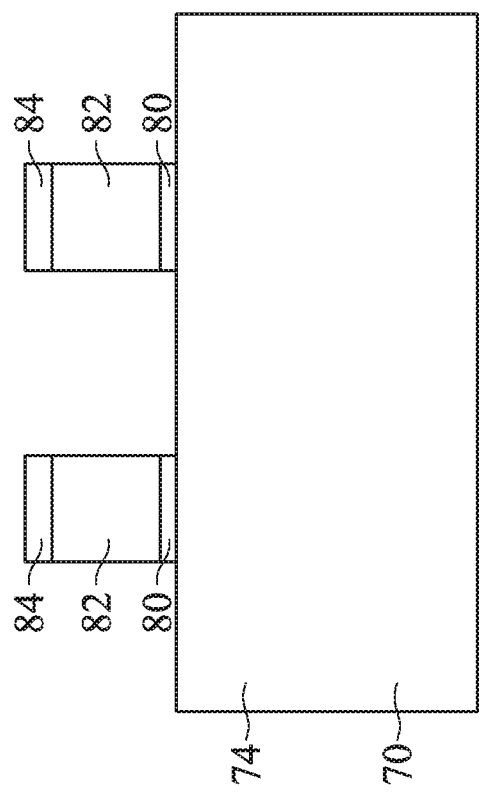

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device structures having lower k features and methods of forming lower k features are described herein. Particularly, embodiments of the present disclosure include forming a dielectric film and treating the dielectric film by a variable temperature annealing process. The variable temperature annealing process may enhance the dielectric film's resistance against damages in subsequent processing, such as etching prior to epitaxial growth, oxidation, and/or ion implantation.

The dielectric film may be used for various dielectric features of a semiconductor device structure. Lowering a k-value in the device can lower a capacitance (e.g., parasitic capacitance) of the device, which can lower the resistance-capacitance (RC) delay value of the device. However, when lowering the k-value, for example by adding carbon or introducing pores to a dielectric material, other properties, such as plasma resistance, may suffer. Embodiments described herein can provide a lower k-value layer having high density and strong plasma resistance and provide methods for forming the layer. The lower k-value layer can have strong plasma resistance and improved capacitance efficiency. Further, processes for forming dielectric features can be implemented with other processes described herein or in other processes and/or contexts.

In some embodiments, the lower k-value layer is a dielectric material including silicon, oxygen, nitrogen, and carbon, for example, SiOCN. In some embodiments, the layer has a k-value of about 4.1. In some embodiments, the layer has a k-value in a range from about 3.0 to about 5.0. The density of the layer may be greater than 2.0 g/cm$^3$. In some embodiments, the density of the layer may be in a range from about 2.0 g/cm$^3$ to about 3.0 g/cm$^3$. In some embodiments, the carbon concentration in the layer can be reduced to improve resistance against oxygen plasma. In some embodiments, the layer has a concentration of carbon in a range from about 0 atomic percent (at. %) to about 5 at. %.

The layer can be formed using an atomic layer deposition (ALD) process by sequentially pulsing a silicon source precursor, a nitrogen-carbon source precursor, and an oxygen source precursor in multiple cycles. An anneal process may be performed after the ALD process to remove carbon and nitrogen. In some embodiments, the anneal process may be performed under varying temperatures.

The foregoing broadly outlines some aspects of embodiments described herein. Some embodiments described herein are described in the context of Fin Field Effect Transistors (FinFETs). Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1A-C through 8A-B are views of respective intermediate structures at various stages in example processes of forming semiconductor devices in accordance with some embodiments. Aspects of FIGS. 1A-C through 5A-B are applicable to a gate-first process and a replacement gate process described herein. FIGS. 6A-B illustrate further aspects of a gate-first process described here. FIGS. 7A-B and 8A-B illustrate further aspects of a replacement gate process as described herein.

Figure 1B:
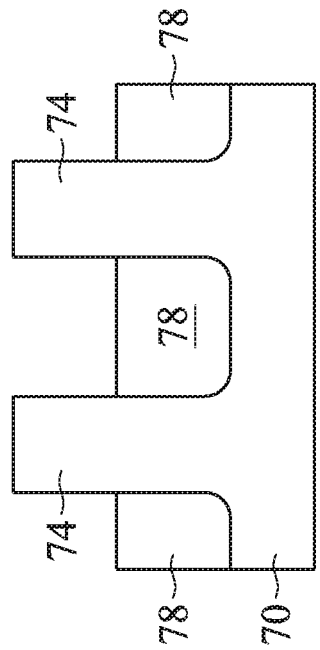
Figure 1C:
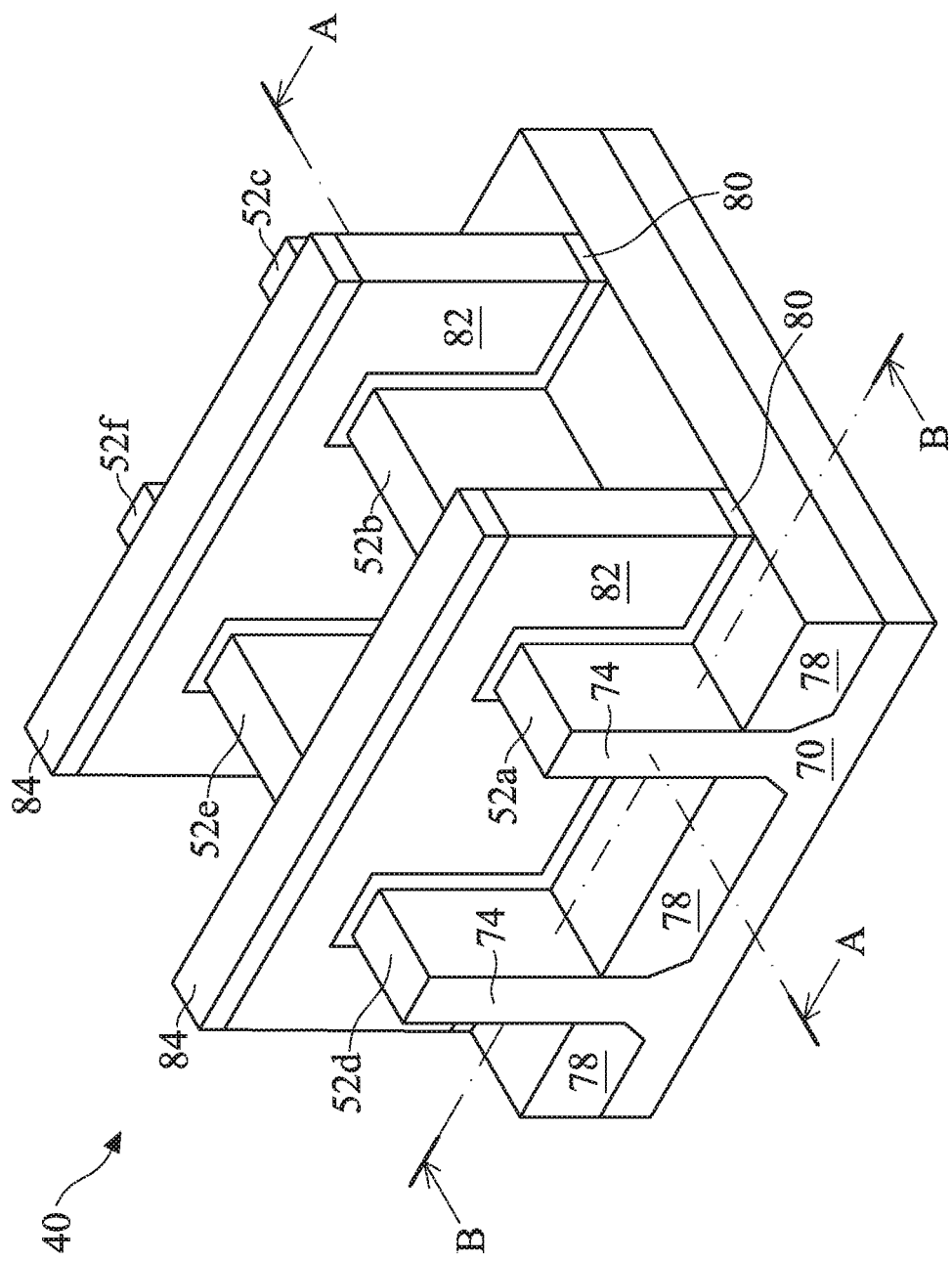

FIGS. 1A, 1B, and 1C illustrate different views of an intermediate structure at a stage in an example process of forming a semiconductor device in accordance with some embodiments. FIGS. 1A and 1B are different cross-sectional views of the intermediate structure, and FIG. 1C is a perspective view of the intermediate structure.

Fins 74 are on a semiconductor substrate 70. Isolation regions 78 are on the semiconductor substrate 70 and are disposed between neighboring fins 74. The fins 74 each protrude above and from between neighboring isolation regions 78. Gate stacks (or more generically, gate structures), with each including a dielectric layer 80, a gate layer 82, and a mask 84, are formed along sidewalls and over top surfaces of the fins 74. Source/drain regions 52$a$-$f$ are disposed in respective regions of the fins 74.

FIG. 1C further illustrates reference cross-sections that are used in other figures. Cross-section A-A is in a plane along, e.g., channels in the fin 74 between opposing source/drain regions 52$a$-$c$. Cross-section B-B is in a plane perpendicular to cross-section A-A and is across source/drain regions 52$a$ and 52$d$ in neighboring fins 74. Figures refer to these reference cross-sections for clarity. Figures ending with an "A" designation illustrate cross-sectional views at various instances of processing corresponding to cross-section A-A, and figures ending with a "B" designation illustrate cross-sectional views at various instances of processing corresponding to cross-section B-B.

The semiconductor substrate 70 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate may include an elemental semiconductor including silicon (Si) or germanium (Ge); a compound semiconductor; an alloy semiconductor; or a combination thereof.

The fins 74 may be formed from the semiconductor substrate 70, such as by etching trenches between the fins 74. The isolation regions 78 may be formed in trenches between the fins 74. The isolation regions 78 may include or be an insulating material such as an oxide (such as silicon oxide), a nitride, the like, or a combination thereof. The fins 74 protrude from between neighboring isolation regions 78, which may, at least in part, thereby delineate the fins 74 as active areas on the semiconductor substrate 70. The fins 74 and isolation regions 78 may be formed by any acceptable processes and can include any acceptable material. In some examples, the fins 74 may include heteroepitaxial structures (e.g., a material lattice-mismatched to the semiconductor material of the semiconductor substrate 70) or other structures.

The gate stacks are formed over and extend laterally perpendicularly to the fins 74. Each gate stack comprises a dielectric layer 80, a gate layer 82, and a mask 84. The gate stacks can be operational gate stacks in a gate-first process or can be dummy gate stacks in a replacement gate process.

In a gate-first process, the dielectric layer 80 may be a gate dielectric, and the gate layer 82 may be a gate electrode. The gate dielectrics may include or be silicon oxide, silicon nitride, a high-k dielectric material, the like, or multilayers thereof. A high-k dielectric material can have a k value greater than about 7.0, and may include a metal oxide or silicate of Hf, Al, Zr, La, Mg, Ba, Ti, Pb, multilayers thereof, or a combination thereof. The gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The masks 84 may include or be silicon nitride, silicon oxynitride, silicon carbon nitride, the like, or a combination thereof. The layers for the masks 84, gate electrodes, and gate dielectrics may be deposited and patterned into the gate stacks using any acceptable processes to form the mask 84, gate layer 82, and dielectric layer 80 for each gate stack.

In a replacement gate process, the dielectric layer 80 may be an interfacial dielectric, and the gate layer 82 may be a dummy gate. The interfacial dielectrics may include or be silicon oxide, silicon nitride, the like, or multilayers thereof. The dummy gates may include or be silicon (e.g., polysilicon) or another material. The masks 84 may include or be silicon nitride, silicon oxynitride, silicon carbon nitride, the like, or a combination thereof. The layers for the masks 84, dummy gates, and interfacial dielectrics may be deposited and patterned into the gate stacks using any acceptable processes to form the mask 84, gate layer 82, and dielectric layer 80 for each gate stack.

FIGS. 2A and 2B illustrate the formation of a first gate spacer layer 86 along sidewalls and top surfaces of the gate stacks and the fins 74. The first gate spacer layer 86 is conformally deposited along sidewalls and top surfaces of the fins 74 and gate stacks (e.g., along sidewalls of dielectric layers 80, gate layers 82, and masks 84, and on top surfaces of masks 84), and on top surfaces of the isolation regions 78. The first gate spacer layer 86 can be or comprise silicon oxycarbonitride (SiOCN) or another material. The first gate spacer layer 86 may have a k-value in a range from about 5.0 to about 7.0. In some examples, the first gate spacer layer 86 can be deposited using an atomic layer deposition (ALD) process, although other deposition techniques can be used. Additional details of an example of the first gate spacer layer 86 are described below with respect to FIG. 9. In some embodiments, the first gate spacer layer 86 may be omitted.

Figures 3A, 3B:
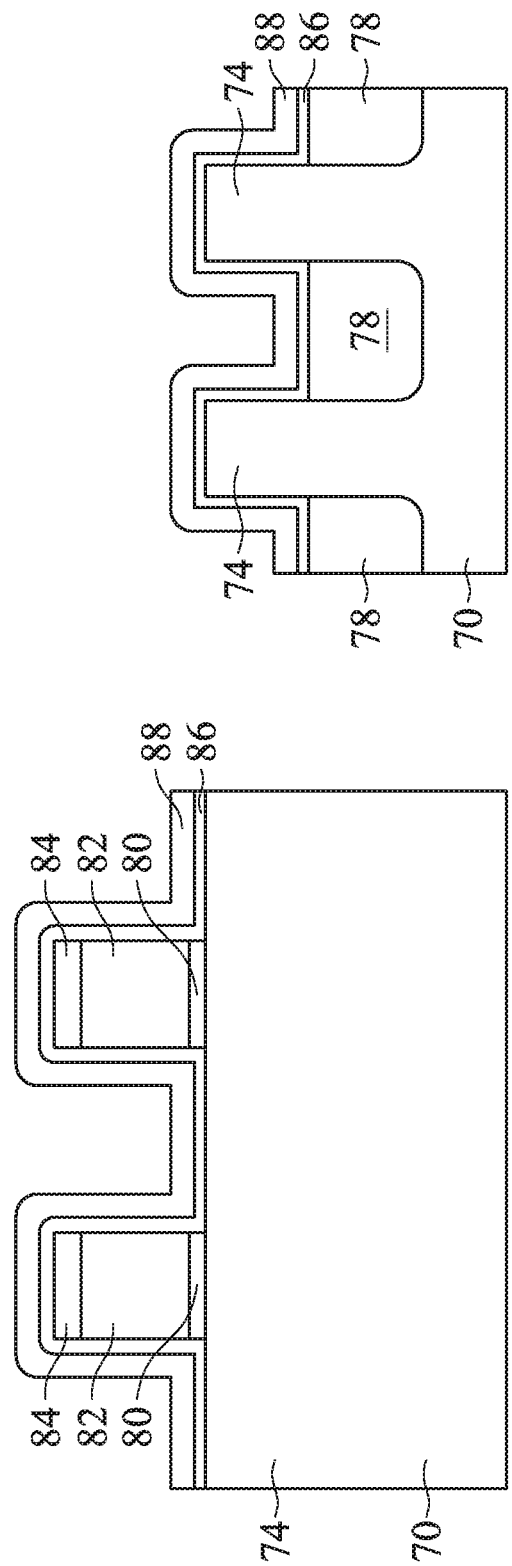

FIGS. 3A and 3B illustrate the formation of a second gate spacer layer 88. The second gate spacer layer 88 is conformally deposited on the first gate spacer layer 86. The second gate spacer layer 88 is a dielectric layer including silicon, oxygen, nitrogen and carbon. In some embodiments, the second gate spacer layer 88 can be or comprise a silicon oxycarbonitride (SiOCN) or another material. In some embodiments, the second gate spacer layer 88 has a concentration of carbon in a range from about 0 at. % to about 5 at. %. In some embodiments, the second gate spacer layer 88 has a concentration of nitrogen in a range from about 0 at. % to about 15 at. %, for example, about 5.3 at. %. In some embodiments, the second gate spacer layer 88 has a concentration of oxygen in a range from about 40 at. % to about 70 at. %, for example, about 65 at. %. In some embodiments, the second gate spacer layer 88 has a concentration of silicon in a range from about 20 at. % to about 40 at. %, for example, about 27 at. %.

The second gate spacer layer 88 may be a high density dielectric layer. The second gate spacer layer 88 may have a density equal to or greater than about 2.0 g/cm$^3$. For example, the second gate spacer layer 88 may have a density in a range from about 2.0 g/cm$^3$ to about 3.0 g/cm$^3$, such as about 2.3 g/cm$^3$. In some embodiments, the second gate spacer layer 88 has a lower k-value than the first gate spacer layer 86. In some embodiments, the second gate spacer layer 88 has a k-value of about 4.1. For example, the second gate spacer layer 88 has a k-value in a range from about 3.0 to about 5.0.

The second gate spacer layer 88 can be formed by sequentially pulsing a silicon source precursor, a nitrogen and carbon source precursor, and an oxygen source precursor in an ALD process followed by an anneal process to reduce a carbon and/or nitrogen concentration. Additional details of examples of the second gate spacer layer 88 and ALD and anneal processes for forming those examples of the second gate spacer layer 88 are described below with respect to FIGS. 10-13.

Figure 4B:
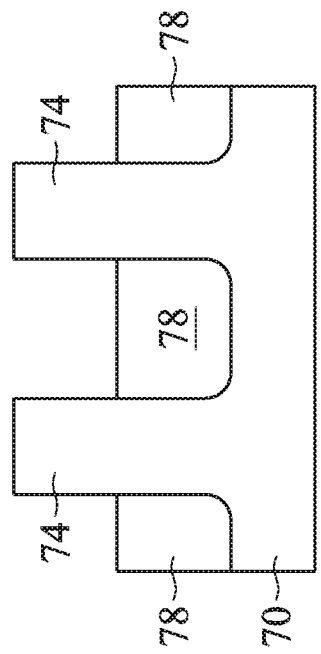
Figure 4A:
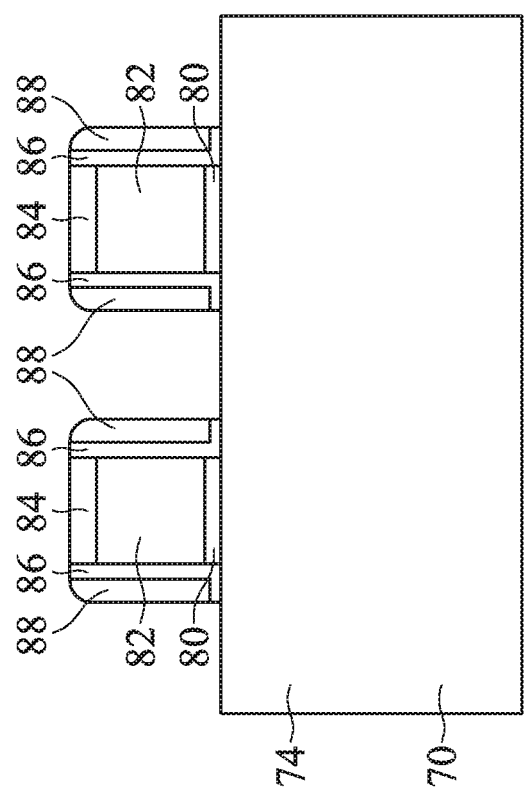

FIGS. 4A and 4B illustrate the formation of gate spacers including respective portions of the first gate spacer layer 86 and the second gate spacer layer 88. Gate spacers (e.g., bi-layer gate spacers, as illustrated) are formed along sidewalls of the gate stacks (e.g., sidewalls of the dielectric layer 80, gate layer 82, and mask 84) and over the fins 74. Residual gate spacers may also remain along sidewalls of the fins 74, for example, depending on the height of the fins 74 above the isolation regions 78. The gate spacers may be formed by anisotropically etching the second gate spacer layer 88 and the first gate spacer layer 86. The etch process can include a RIE, NBE, or another etch process. The multi-layer gate spacers may include additional and/or different layers and/or materials in other embodiments.

Figure 5A:
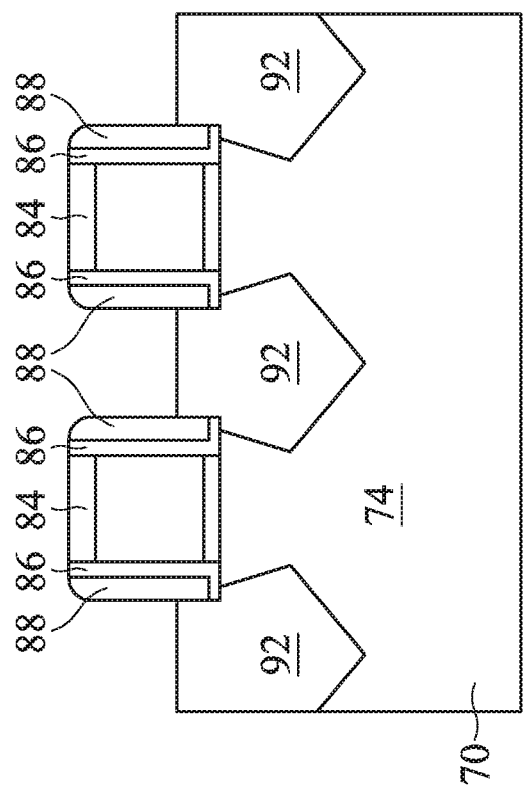
Figure 5B:
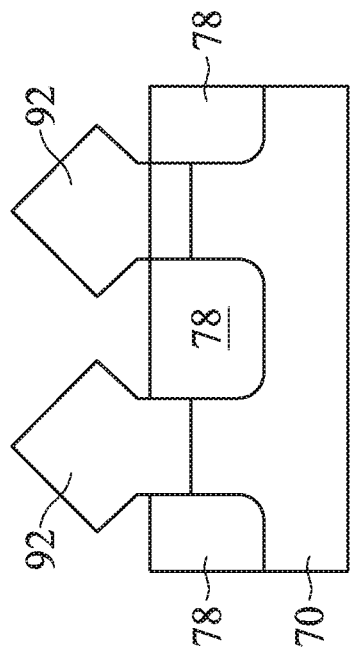
Figures 6A, 6B:
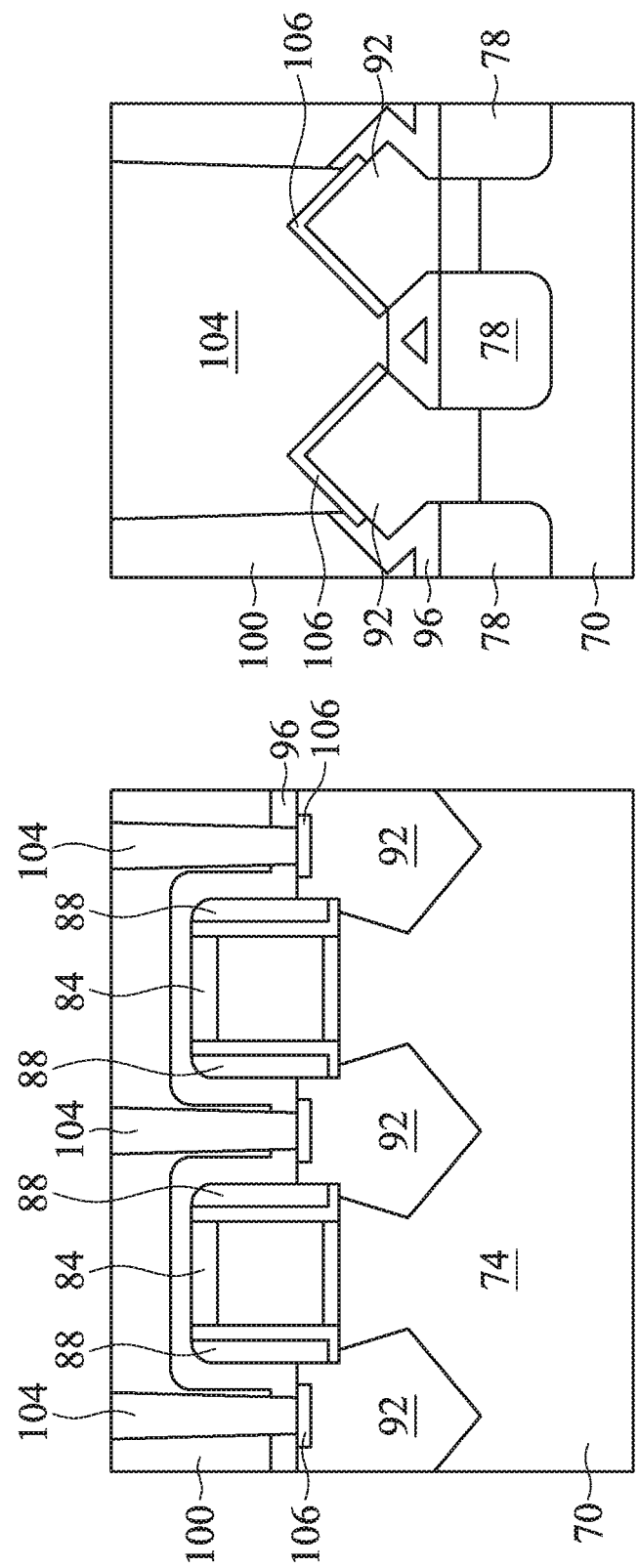

FIGS. 5A and 5B illustrate the formation of source/drain regions 92. Recesses are formed in the fins 74 on opposing sides of the gate stacks, and the source/drain regions 92 are formed in the recesses. The recessing can be by an etch process. The etch process can be isotropic or anisotropic, or further, may be selective with respect to one or more crystalline planes of the semiconductor substrate 70. Hence, the recesses can have various cross-sectional profiles based on the etch process implemented. While forming the recess, the second gate spacer layer 88 can be exposed to the etch chemistry. The second gate spacer layer 88, as described herein, can have improved resistance against the etching chemistry while maintaining a lower k-value for target capacitance efficiency.

In some embodiments, a cleaning process may be performed prior to epitaxial growth of the source/drain regions 92 in the recesses to remove impurities from the fins 74. For example, a plasma, such as an oxygen plasma, may be used to clean the surfaces. Because of the low carbon concentration, the second gate spacer layer 88 can withstand the cleaning plasma without suffering significant damage.

After the cleaning process, epitaxy source/drain regions 92 may be formed in the recesses. The epitaxy source/drain regions 92 may include or be silicon germanium, silicon carbide, silicon phosphorus, a III-V compound semiconductor, a II-VI compound semiconductor, or the like. The epitaxy source/drain regions 92 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxy source/drain regions 92 may extend beyond sidewalls and top surfaces of the fins 74 (e.g., are raised) and may have facets, which may correspond to crystalline planes of the semiconductor substrate 70. In some examples, different materials are used for epitaxy source/drain regions 92 for p-type devices and n-type devices. Appropriate masking during the recessing or epitaxial growth may permit different materials to be used in different devices.

A person having ordinary skill in the art will also readily understand that the recessing and epitaxial growth of source/drain regions 92 may be omitted, and that source/drain regions may be formed by implanting dopants into the fins 74 using the gate stacks and gate spacers as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated. Because of the high density of the second gate spacer layer 88, the second gate spacer layer 88 may be able to withstand the implantation process with less damage from the bombardment of particles compared to some other gate spacer materials.

FIGS. 6A and 6B, in continuation of a gate-first process, illustrate the formation of dielectric layers over the fins 74, epitaxy source/drain regions 92, and gate stacks, and the formation of conductive features 104 through the dielectric layers to the epitaxy source/drain regions 92. After the formation of the source/drain regions 92, a contact etch stop layer (CESL) 96 is conformally deposited by any acceptable process, on surfaces of the epitaxy source/drain regions 92, sidewalls and top surfaces of the multi-layer gate spacers, top surfaces of the mask 84, and top surfaces of the isolation regions 78. Generally, an etch stop layer can provide a mechanism to stop an etch process when forming, e.g., contacts or vias. An etch stop layer may be formed of a dielectric material having a different etch selectivity from adjacent layers or components. The CESL 96 may include silicon nitride, silicon carbon nitride, the like, or a combination thereof.

A first interlayer dielectric (ILD) 100 may be formed over the CESL 96. The first ILD 100 may comprise or be silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 100 may be deposited by any acceptable process. In a gate-first process as shown in FIGS. 6A and 6B, a top surface of the first ILD 100 may be above the upper portions of the CESL 96 and the gate stacks. Hence, the upper portions of the CESL 96 may remain over the gate stacks.

Conductive features 104 are then formed in openings through the first ILD 100 and CESL 96 to connect with the epitaxy source/drain regions 92. The conductive features 104 may include an adhesion and/or barrier layer and conductive material on the adhesion and/or barrier layer, for example. In some examples, the conductive features 104 may include silicide regions 106 on the epitaxy source/drain regions 92, as illustrated. The adhesion and/or barrier layer can be conformally deposited in the openings and over the first ILD 100. The adhesion and/or barrier layer may be or comprise titanium, titanium nitride, titanium oxide, tantalum, tantalum nitride, tantalum oxide, the like, or a combination thereof. Silicide regions 106 may be formed on upper portions of the epitaxy source/drain regions 92 by reacting upper portions of the epitaxy source/drain regions 92 with the adhesion and/or barrier layer. An anneal process can be performed to facilitate the reaction of the epitaxy source/drain regions 92 with the adhesion and/or barrier layer. The conductive material can be deposited on the adhesion and/or barrier layer and fill the openings. The conductive material may be or comprise tungsten, copper, aluminum, gold, silver, alloys thereof, the like, or a combination thereof. The conductive features 104 may be or may be referred to as contacts, plugs, etc.

FIGS. 7A-B and 8A-B illustrate further aspects of a replacement gate process as described herein. Processing is first performed as described above with respect FIGS. 1A-C through 5A-B and then proceeds to FIGS. 7A-B.

Figures 7A, 7B:
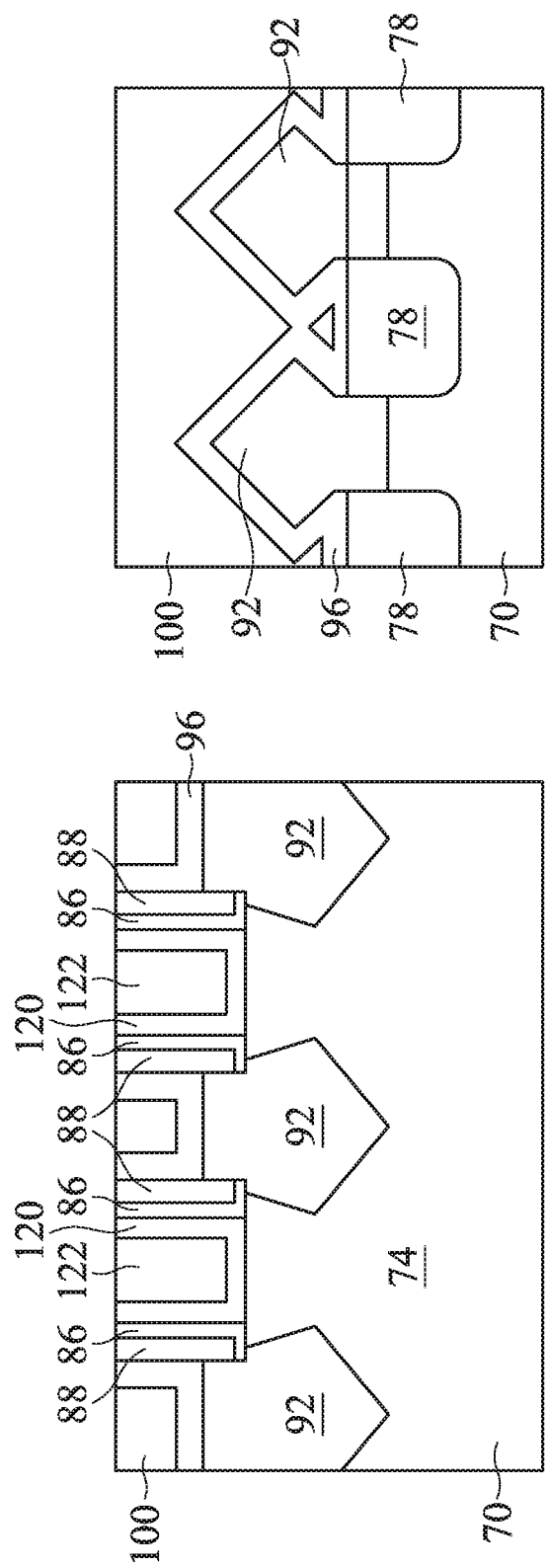

FIGS. 7A and 7B illustrate the replacement of gate stacks with replacement gate structures after formation of the epitaxial source/drain region in FIGS. 5A-5B. The CESL 96 and first ILD 100 may be formed as described in FIGS. 6A-B. The first ILD 100 and CESL 96 are formed with top surfaces coplanar with top surfaces of the gate layers 82. A planarization process, such as a CMP, may be performed to level the top surface of the first ILD 100 and CESL 96 with the top surfaces of the gate layers 82. The CMP may also remove the mask 84 (and, in some instances, upper portions of the multi-layer gate spacers) on the gate layers 82. Accordingly, top surfaces of the gate layers 82 are exposed through the first ILD 100 and the CESL 96.

With the gate layers 82 exposed through the first ILD 100 and the CESL 96, the gate layers 82 and the dielectric layers 80 are removed, such as by one or more etch processes. The gate layers 82 may be removed by an etch process selective to the gate layers 82, wherein the dielectric layers 80 act as etch stop layers, and subsequently, the dielectric layers 80 can be removed by a different etch process selective to the dielectric layers 80. The etch processes can be, for example, a RIE, NBE, a wet etch, or another etch process. Recesses are formed between multi-layer gate spacers where the gate stacks are removed, and channel regions of the fins 74 are exposed through the recesses.

During removal of the gate layers 82 and the dielectric layers 80, the top of the second gate spacer layer 88 is exposed to the etch chemistry. The second gate spacer layer 88 can have improved density to withstand the etching chemistry reducing spacer loss during etch and improve capacitance efficiency in the device.

After the gate layers 82 and the dielectric layers 80 are removed, the replacement gate structures are formed in the recesses where the gate stacks were removed. The replacement gate structures each include one or more conformal layers 120 and a gate electrode 122. The one or more conformal layers 120 include a gate dielectric layer and may include one or more work-function tuning layers. The gate dielectric layer can be conformally deposited in the recesses where gate stacks were removed. The gate dielectric layer can be or include silicon oxide, silicon nitride, a high-k dielectric material, multilayers thereof, or other dielectric material. Then, if implemented, a work-function tuning layer may be conformally deposited on the gate dielectric layer. The work-function tuning layer may include or be tantalum, tantalum nitride, titanium, titanium nitride, the like, or a combination thereof. Any additional work-function tuning layers may be sequentially deposited similar to the first work-function tuning layer. Gate electrodes 122 are formed over the one or more conformal layers 120. The layer for the gate electrodes 122 can fill remaining recesses where the gate stacks were removed. The gate electrodes 122 may be or comprise a metal-containing material such as Co, Ru, Al, W, Cu. multi-layers thereof, or a combination thereof.

FIGS. 8A and 8B illustrate the formation of a second ILD 130 over the replacement gate structures and the first ILD 100, and the formation of conductive features 134 through the second ILD 130, the first ILD 100, and the CESL 96 to the epitaxy source/drain regions 92. The second ILD 130 is formed over the first ILD 100, replacement gate structures, gate spacer layers, and CESL 96. Although not illustrated, in some examples, an etch stop layer (ESL) may be deposited over the first ILD 100, etc., and the second ILD 130 may be deposited over the ESL. If implemented, the ESL may comprise or be silicon nitride, silicon carbon nitride, silicon carbon oxide, carbon nitride, the like, or a combination thereof. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The conductive features 134 may be formed through the second ILD 130, first ILD 100, and CESL 96 to the epitaxy source/drain regions 92, and with silicide regions 136, similarly as described above with respect to the conductive features 104 of FIGS. 6A-B.

Figure 9:
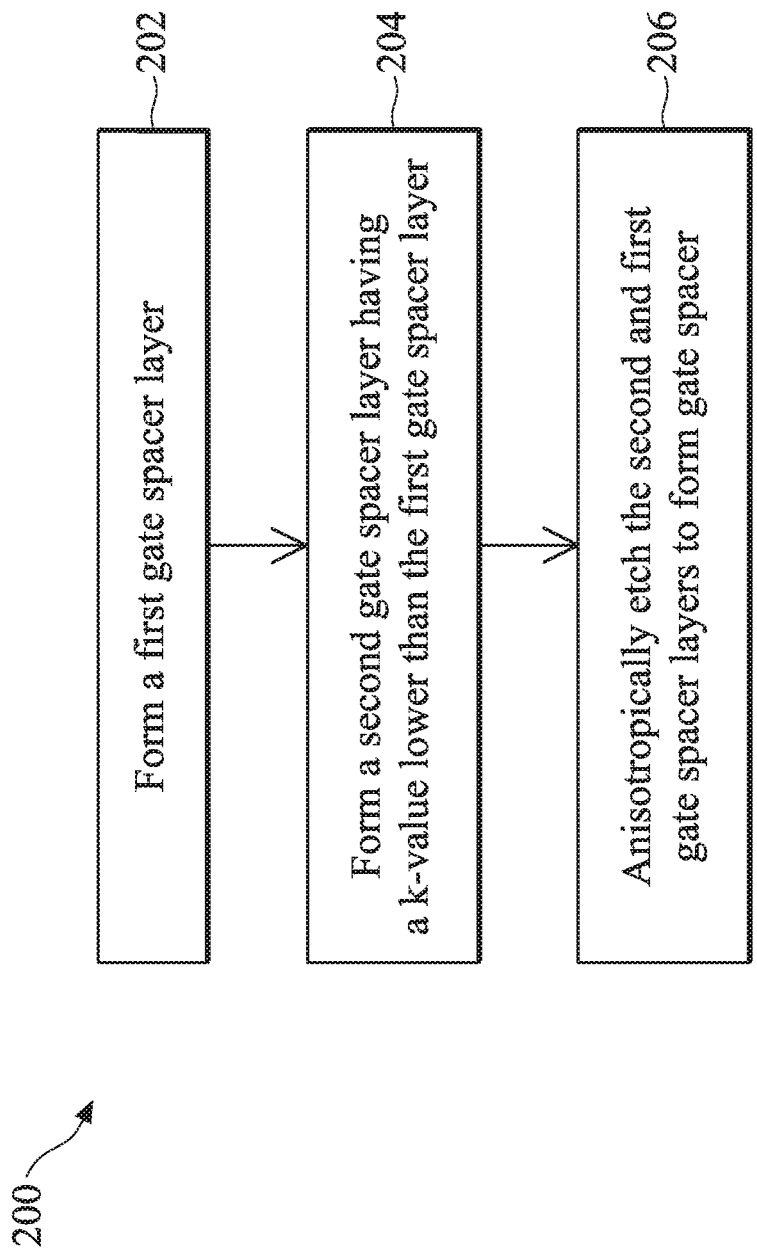
FIG. 9 is a process flow for forming a gate spacer in accordance with some embodiments.

FIG. 9 is a process flow 200 for forming a gate spacer in accordance with some embodiments. In operation 202, optionally, a first gate spacer layer is formed on a device structure, such as generally illustrated in and described with respect to FIGS. 2A and 2B. The first gate spacer layer may be formed by an ALD process. The first gate spacer layer may be a SiOCN layer, a SiN layer, a SiON layer, or the like. The first gate spacer layer may have a higher k-value than a subsequent gate spacer layer. This operation 202 may be omitted.

Figure 10:
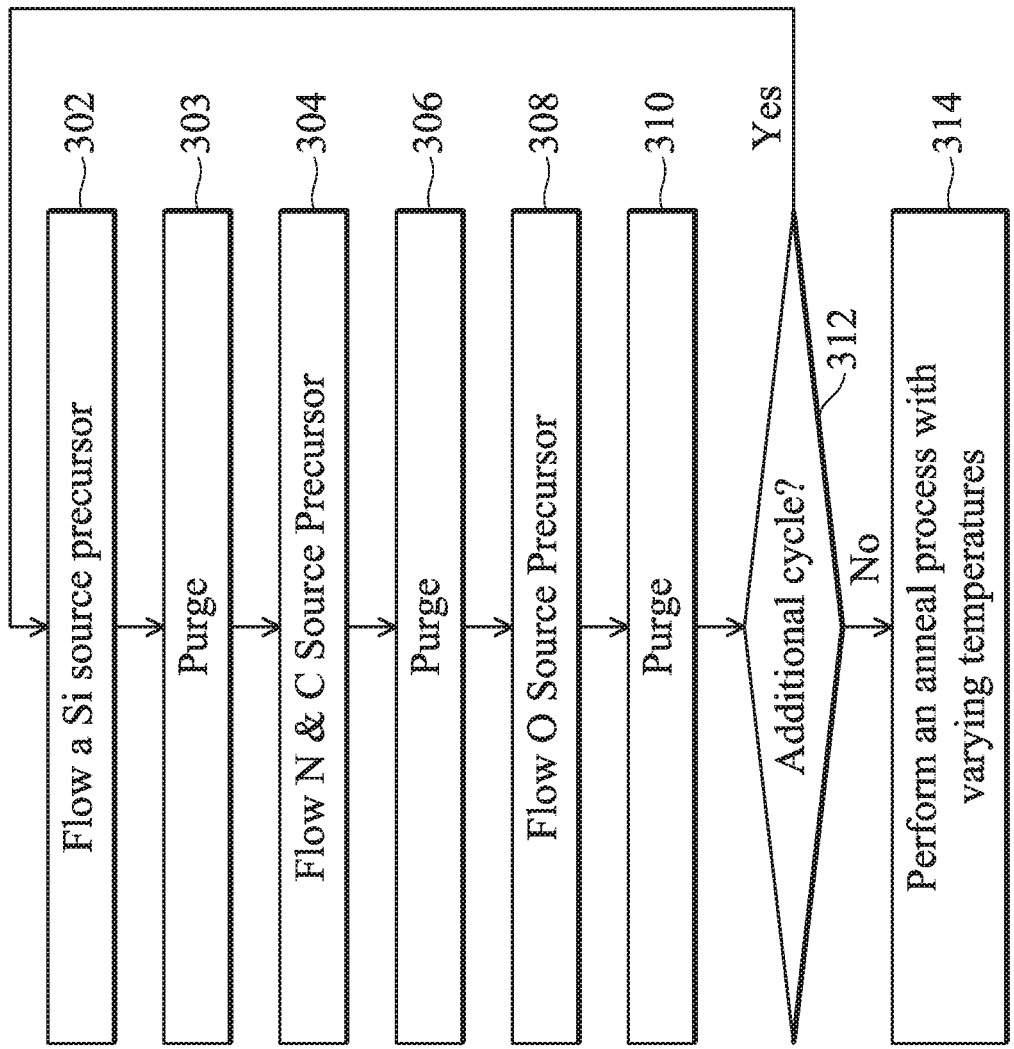
FIG. 10 is process flow for forming and treating a material in accordance with some embodiments.

In operation 204, a second gate spacer layer is formed using an ALD process and an anneal process to achieve a target film density and a target k-value. The second gate spacer layer is formed on the first gate spacer layer, if optionally implemented, or on the device structure. Generally, the formation of the second gate spacer layer is illustrated in and described with respect to FIGS. 3A and 3B. The second gate spacer layer may be a SiOCN layer having a low carbon concentration, such as a carbon concentration in a range above 0 to 5 at. %. The second gate spacer layer has a lower k-value than the first gate spacer layer. In some embodiments, operation 204 includes forming a dielectric layer using an ALD process and annealing the dielectric layer after the ALD process. FIG. 10 describes a process can be used in operation 204 according to some embodiments of the present disclosure.

In operation 206, the second gate spacer layer and the first gate spacer layer, if implemented, are anisotropically etched to form the gate spacer, such as generally illustrated in and described with respect to FIGS. 4A and 4B.

FIG. 10 is a process flow 300 for forming a dielectric layer, such as the second gate spacer layer 88, in accordance with some embodiments. The process flow 300 may be used to form the second gate spacer layer in operation 204.

The process flow 300, in this example, includes an ALD process and an anneal process. The layer formed by the process flow 300 can be or comprise silicon oxycarbonitride (SiOCN) or another material. The layer in process flow 300 may be formed by the ALD process comprising sequentially flowing a silicon source precursor, a nitrogen and carbon source precursor, and an oxygen source precursor in multiple cycles. The anneal process is performed after the ALD process to achieve a target k-value and material properties. The reactions among the precursors combined with the anneal process can enable a dielectric film that has a lower k-value, strong plasma and etch chemistry resistivity, and high density against physical bombardment in subsequent processes. When used in a gate spacer layer, the layer can provide a film with a lower k-value for capacitance efficiency and a strong film against damages in the subsequent processes, resulting in a transistor with improved performance.

Operations 302 through 310 illustrate a cycle of the ALD process. The cycle includes alternating flow (or pulse) and purge operations, where each precursor is flowed (or pulsed) and subsequently purged at least once during the cycle. In some embodiments, the ALD process may be performed in an ALD chamber at a temperature range from about 400° C. to about 800° C., for example about 600° C. FIG. 11A through 11H schematically illustrate reactions during the ALD process according to some embodiments.

In operation 302, the silicon source precursor is flowed in an ALD chamber. The silicon source precursor is flowed in an ALD tool chamber having a substrate to be processed, for example, a substrate having device structure shown in FIGS. 2A-B formed thereon. The silicon source precursor reacts with the terminals on the substrate surface forming a monolayer of intermediate products. In some embodiments, the silicon source precursor may be hexachlorodisilane (HCD, $Si_2Cl_6$) or others.

Figure 11B:
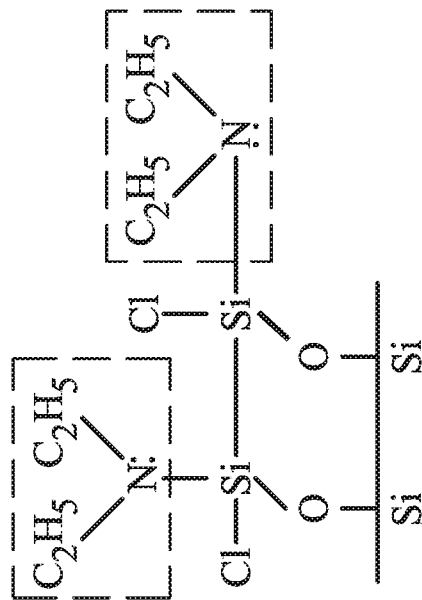
FIG. 11A through 11H are schematic illustrations of reactions during formation and treatment of a material formed in FIG. 10 in accordance with some embodiments.
Figure 11A:
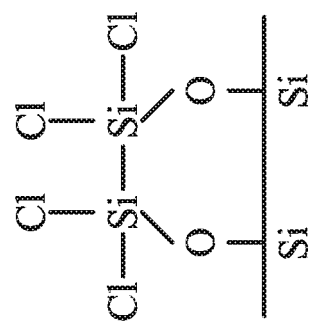

FIG. 11A schematically illustrates bonds on the substrate surface of the device structure shown in FIGS. 2A-2B, which has a surface of a dielectric material, for example, the first gate spacer layer 86. As shown in FIG. 11A, the surface has terminals of oxygen atoms (or hydroxide (—OH) groups (not illustrated)) connected to silicon. FIG. 11B schematically illustrates reactions on the surface in operation 302 when HCD is flowed in the ALD chamber. For example, the HCD under the temperature in the ALD chamber may react with the terminals of the surface to attach silicon and chlorine atoms to the oxygen atoms on the surface thereby forming O—Si—Cl bonds on the substrate surface, while chlorine atoms (e.g., hydrogen chloride when the surface is terminated with hydroxide groups) is produced as a byproduct. In some embodiments, an HCD precursor reacts with the substrate surface forming a first intermediate film of a monolayer of molecules on the substrate surface.

In operation 303, the ALD chamber is purged to remove by-products and unconsumed silicon source precursor in operation 302 from the ALD chamber.

Figure 11D:
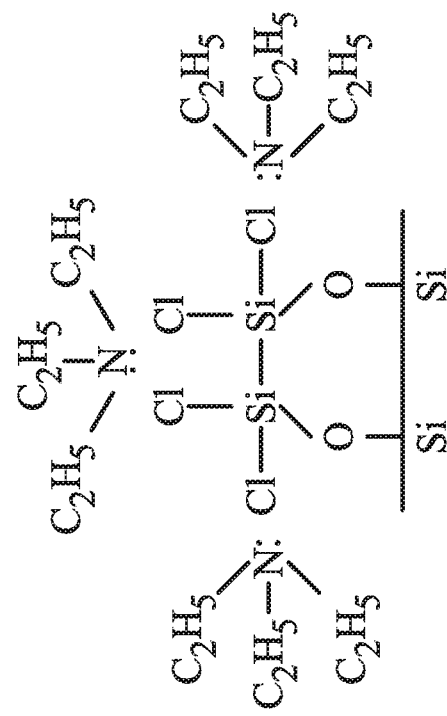
Figure 11C:
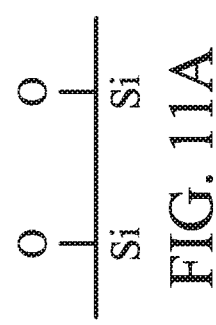

In operation 304, a nitrogen and carbon source precursor is flowed into the ALD chamber. In some embodiments, the nitrogen and carbon source precursor may include Triethylamine ($N(C_2H_5)_3$, also known as RENA) or others. FIG. 11C schematically illustrates RENA molecules approaching the substrate surface with Si—Cl bonds. RENA may decompose in the ALD chamber and react with the intermediate film on the substrate surface. For example, a bond to N in the decomposed RENA may break off to allow the decomposed RENA to replace Cl in the Si—Cl bonds on the substrate surface to form a second intermediate film. The chlorine atom breaking away from the Si—Cl bond may react with hydrogen in the decomposed RENA to form hydrogen chloride as a by-product. In some embodiments, RENA may react with surface layers to form the second intermediate film of a monolayer of molecules on the substrate surface. In some embodiments, the second intermediate film may include RENA in multiple transition states as shown in FIG. 11D.

In operation 306, the ALD chamber is purged to remove by-products and unconsumed nitrogen and carbon source precursor in operation 304 from the ALD chamber.

In operation 308, an oxygen source precursor is flowed to the ALD chamber. In some embodiments, the oxygen source precursor may include oxygen gas ($O_2$). Decomposed RENA on the second intermediate film may further thermally decompose in the $O_2$ environment resulting in N—H bonds and releasing $CO_2$ and $H_2O$. An example reaction may be:

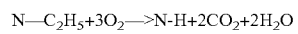

$$N—C_2H_5 + 3O_2 \rightarrow N-H + 2CO_2 + 2H_2O$$

Figure 11F:
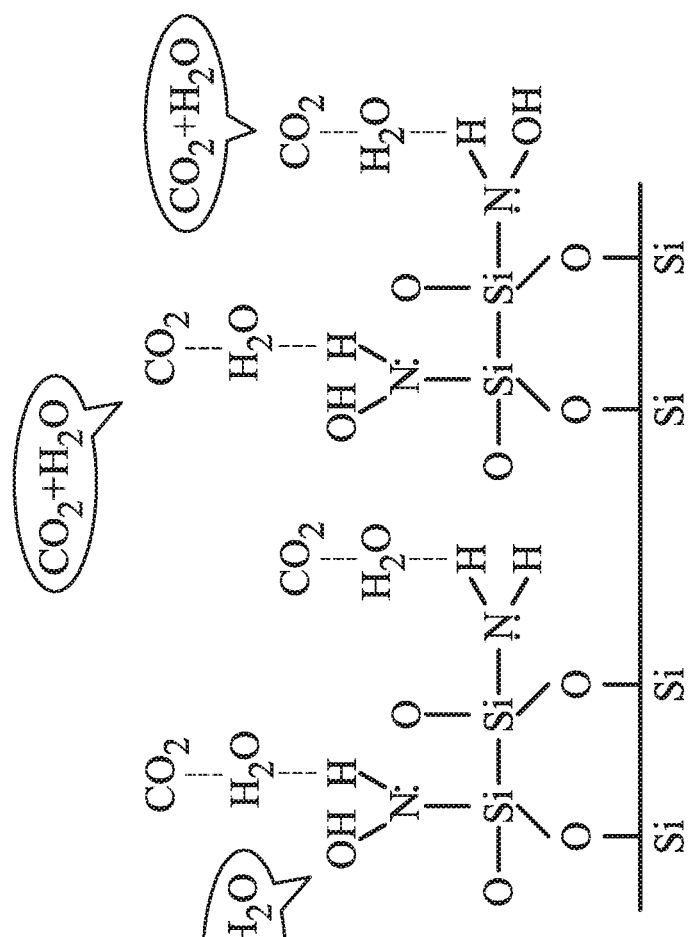
Figure 11E:
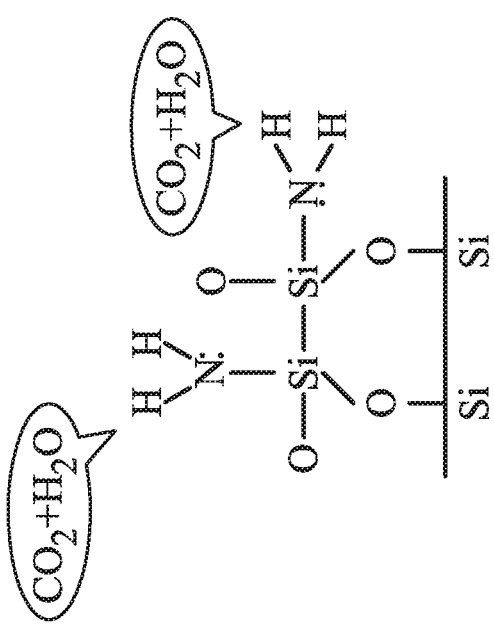

FIGS. 11E and 11F schematically illustrate the surface reaction in operation 308.

In operation 310, the ALD chamber is purged to remove by-products and unconsumed oxygen source precursor in operation 308 from the ALD chamber.

Figure 11G:
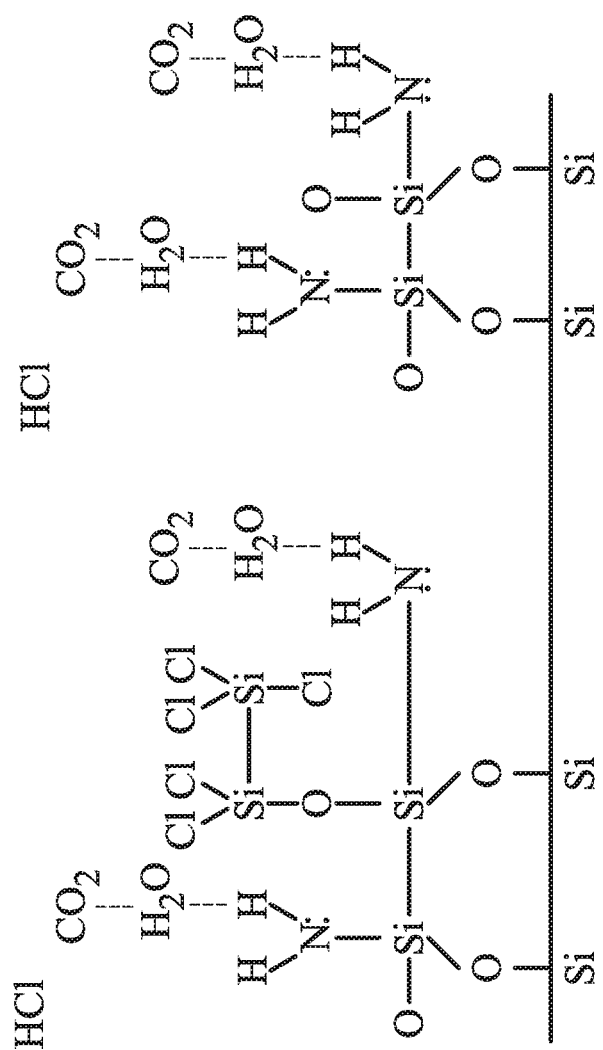

One cycle of the ALD process includes operations 302 to 310. After operation 310, a determination is made, in operation 312, whether additional cycles are to be performed. If so, another cycle is performed. Any number of cycles can be performed to deposit a gate spacer layer with a desired thickness. FIG. 11G schematically illustrates HCD reacting with the oxygen atom on the surface to start a new cycle.

If no additional cycles are needed, the ALD process can be concluded. The deposited film may be a SiON:C material including Si—O, Si—N, and Si—N—$CO_2$ bonds. After deposition, the film may include carbon in a range from about 0 at. % to about 5 at. %, for example, about 2.0 at. %. After deposition, the film may include nitrogen in a range from about 0 at. % to about 15 at. %, for example, about 6.3 at. %. After deposition, the film may include silicon in a range from about 20 at. % to about 40 at. %, for example, about 27.4 at. %. After deposition, the film may include oxygen in a range from about 40 at. % to about 70 at. %, for example, about 64.3 at. %.

In operation 314, an anneal process is performed on the film formed by the ALD process to achieve a desired property. The anneal process may be performed in an environment containing $N_2$, $O_2$, or $H_2$.

In some embodiments, the anneal process is performed under varying temperature. For example, the anneal process is performed under varying temperature in a $N_2$ environment. In an embodiment, the anneal process may include annealing the substrate for a first period of time while ramping up the anneal temperature, annealing the substrate for a second period of time while maintaining a constant anneal temperature, and annealing the substrate for a third period of time while ramping down the anneal temperature. Ramping up the anneal temperature and ramping down the anneal temperature may be performed at constant rates or variable rates. For example, a fast ramp up rate may be used at low temperatures and a low ramp up rate may be used at high temperatures. Similarly, a low ramp down rate may be used at high temperatures and a fast ramp down rate may be used at low temperatures.

Figure 12:
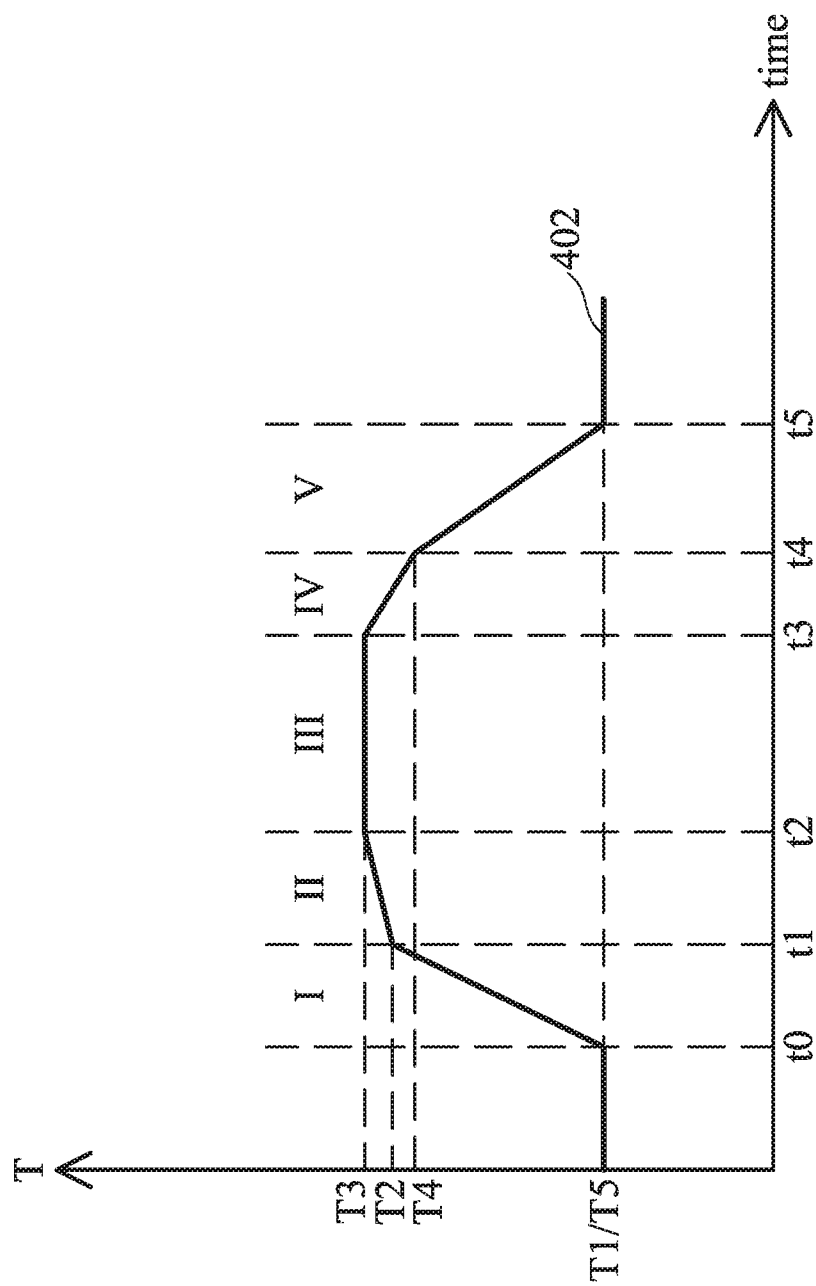
FIG. 12 is a plot of temperature variation during an anneal process in accordance with some embodiments.

FIG. 12 includes a temperature-time profile 402 for an anneal process in a $N_2$ environment. In an embodiment, the anneal process may be performed in a $N_2$ environment at about one atmosphere pressure (1.0 atm). The anneal process may be performed in an anneal chamber. The anneal chamber may be kept at a temperature T1 while the substrate being processed is transferred in or out of the chamber. T1 may be in a range from about 200° C. to about 500° C., for example, about 400° C.

In the example of FIG. 12, the anneal process is performed in five stages. In stage I, the temperature ramps up from T1 to T2 at a high rate. T2 may be in a range from about 400° C. to about 600° C., for example about 580° C. At stage I, the temperature may ramp up at a rate in a range from about 1° C./min to about 20° C./min, for example, about 9° C./min. Stage I may be performed for a time period in a range from about 5 minutes to about 80 minutes, for example, about 20 minutes.

In stage II, the temperature ramps up from T2 to T3 at a low rate. T3 may be in a range from about 600° C. to about 1000° C., for example about 700° C. At stage II, the temperature may ramp up at a rate in a range from about 1° C./min to about 20° C./min, for example, about 3° C./min. Stage II may be performed for a time period in a range from about 5 minutes to about 80 minutes, for example, about 40 minutes. Together, stages I and II may increase or ramp up a temperature for a time period in a range from about 5 minutes to about 180 minutes, for example, about at least 60 minutes.

In stage III, the temperature is maintained at temperature T3. Stage III may be performed for a time period in a range from about 0 minutes to about 200 minutes, for example, about 60 minutes.

In stage IV, the temperature ramps down from T3 to T4 at a low rate. T4 may be in a range from about 400° C. to about 600° C., for example, about 580° C. At stage IV, the temperature may ramp down at a rate in a range from about 1° C./min to about 20° C./min, for example, about 4° C./min. Stage IV may be performed for a time period in a range from about 5 minutes to about 80 minutes, for example, about 30 minutes.

In stage V, the temperature ramps down from T4 to T5 at a high rate. T5 may be in a range from about 200° C. to about 500° C., for example, about 400° C. At stage V, the temperature may ramp down at a rate in a range from about 1° C./min to about 20° C./min, for example, about 7° C./min. Stage V may be performed for a time period in a range from about 5 minutes to about 80 minutes, for example, about 28 minutes. T5 may be equal to or different from T1. Together, stages IV and V may decrease or ramp down a temperature for a time period in a range from about 5 minutes to about 180 minutes, for example, about at least 60 minutes.

Figure 11H:
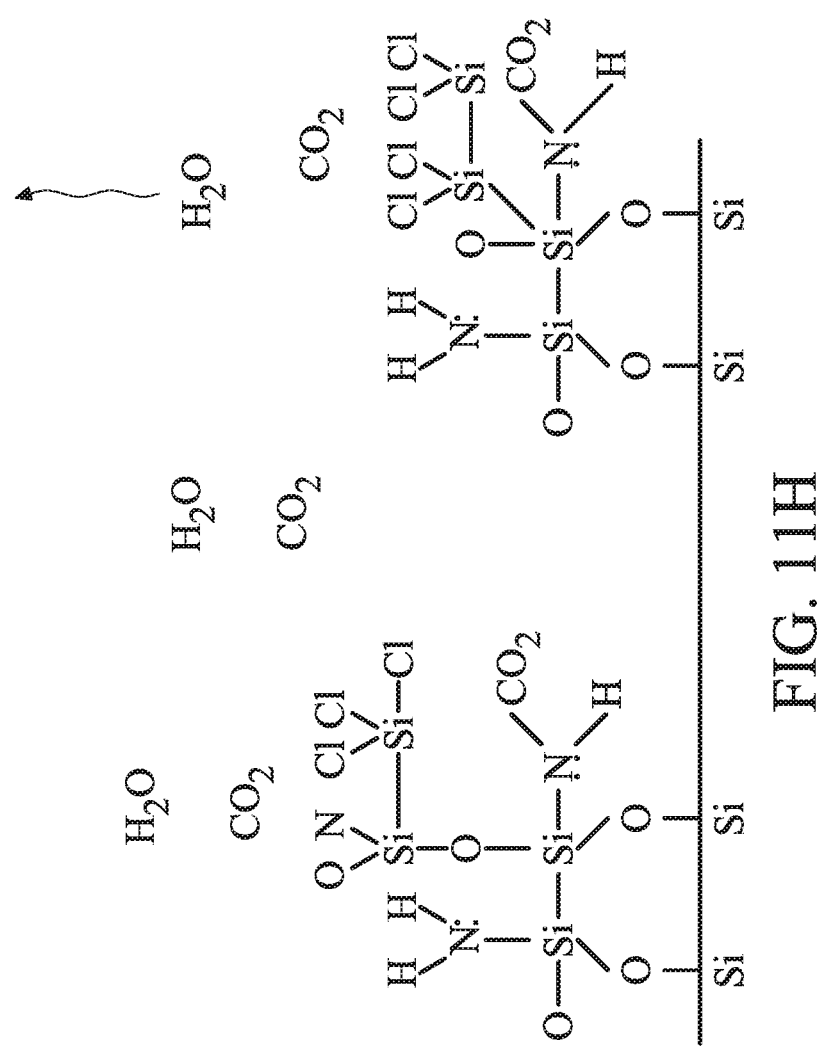

During the anneal process in operation 314, some carbon (in the form of carbon dioxide) and some nitrogen in the form of NH are removed. Removal of carbon increases resistivity against plasma, for example oxygen plasma. FIG. 11H schematically illustrates carbon and nitrogen removal during the anneal process. Removal of nitrogen lowers k-value. In some embodiments, the film may have a k-value lower than 4.1. After anneal, the film may include carbon in a range from about 0 at. % to about 5 at. %, for example, about 1.0 at. % or less. After anneal, the film may include nitrogen in a range from about 0 at. % to about 15 at. %, for example, about 5.3 at. %. After anneal, the film may include oxygen in a range from about 40 at. % to about 70 at. %, for example, about 65.3 at. %. After anneal, the film may include silicon in a range from about 20 at. % to about 40 at. %, for example, about 28.4 at. %.

The second gate spacer layer 88 may be a high density dielectric layer. The second gate spacer layer 88 may have a density greater than 2.0 g/cm$^3$. For example, the second gate spacer layer 88 may have a density in a range from 2.0 g/cm$^3$ and 3.0 g/cm$^3$, such as 2.3 g/cm$^3$. In some embodiments, the second gate spacer layer 88 has a lower k-value than the first gate spacer layer 86. In some embodiments, the second gate spacer layer 88 has a k-value of about 4.1. For example, the second gate spacer layer 88 has a k-value in a range from about 3.0 to about 5.0.

In another embodiment, operation 314 may be performed by at a constant anneal temperature, for example, an anneal process in a hydrogen environment at a constant temperature. In one example, the anneal process may be performed in a hydrogen environment at an anneal temperature in a range from about 200° C. to about 600° C., for example, about 450° C. The anneal process may be performed for a duration in a range from about 0 seconds to about 2000 seconds, for example, about 600 seconds. During anneal, the anneal chamber may be at a lower pressure in a range from about 0 torr to about 10 torr, for example, about 2 torr. In some embodiments, the hydrogen environment may include a hydrogen plasma.

Figure 13:
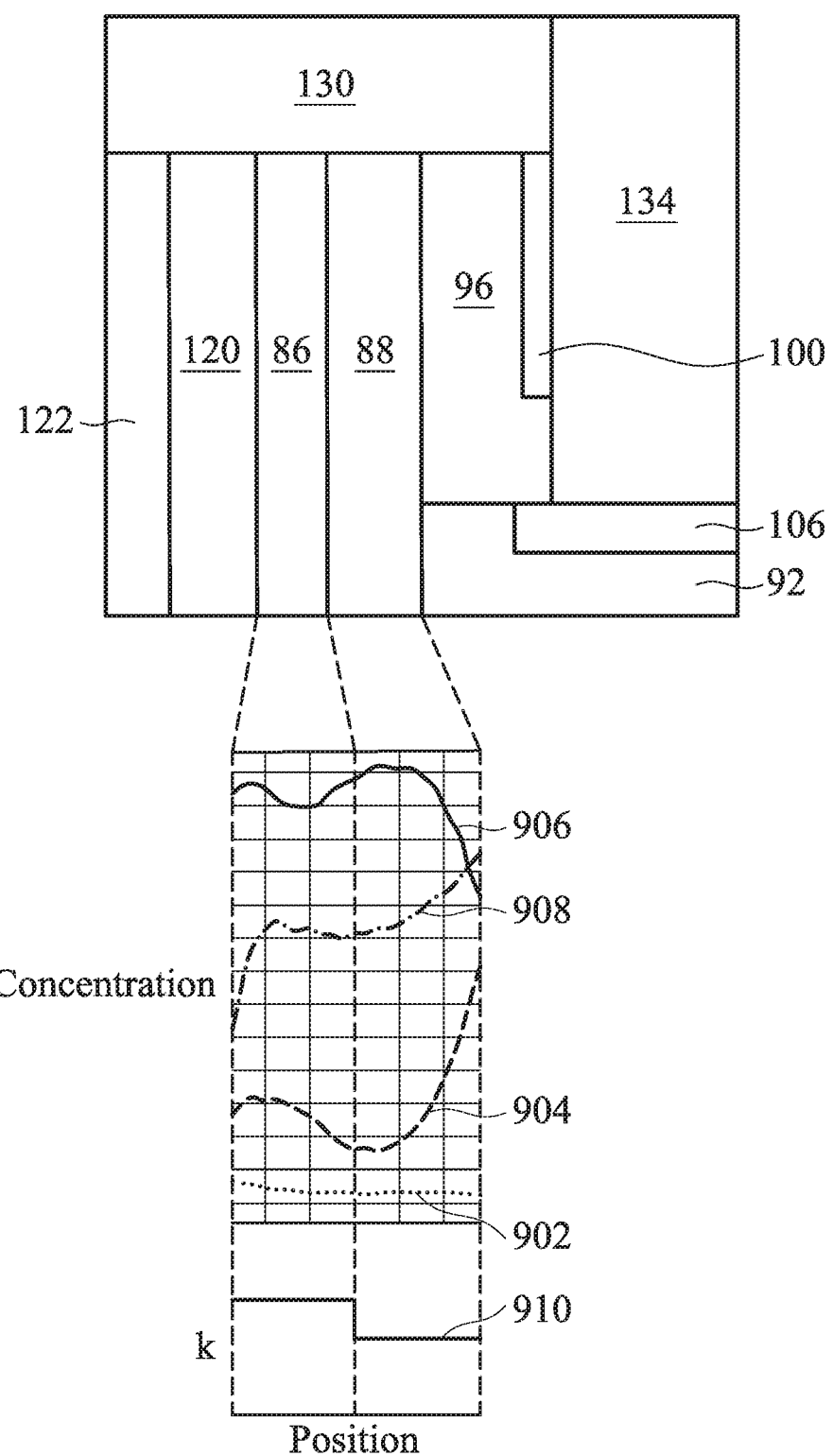
FIG. 13 is a cross-sectional view of a portion of the intermediate structure of FIG. 8A to illustrate additional details of a gate spacer layer formed according to the process flow of FIG. 10 in accordance with some embodiments.

FIG. 13 illustrates a cross-sectional view of a portion of the intermediate structure of FIG. 8A to illustrate additional details of a first gate spacer layer 86 and a second gate spacer layer 88 formed according to the process flow 300 of FIG. 10 in accordance with some embodiments. The first gate spacer layer 86 and second gate spacer layer 88 have a carbon concentration profile 902, a nitrogen concentration profile 904, an oxygen concentration profile 906, a silicon concentration profile 908, and a k-value profile 910. In some examples, the carbon concentration 902 in the second gate spacer layer 88 is in the range from 0 at. % to 5 at. %, such as less than 3 at. %, and more particularly, less than 1 at. %. The second gate spacer layer 88 may experience further carbon loss (e.g., loss of about 1 at. % to about 2 at. %) during processing subsequent to, e.g., the anneal of operation 314. Hence the carbon concentration 902 in the second gate spacer layer 88 may be equal to or less than any of: about 5 at. %, about 4 at. %, about 3 at. %, about 2 at. %, about 1 at. %, and about 0 at. %. Compared to the first gate spacer layer 86, the second gate spacer layer 88 has a lower k-value and lower carbon concentration.

Semiconductor device structures having dielectric features and methods of forming dielectric features are described herein. In some examples, the dielectric features are formed by an ALD process followed by a varying temperature anneal process. The dielectric features can have high density, low carbon concentration, and lower k-value. The dielectric features formed according to the present disclosure can have improved resistance against etching chemistry, plasma damage, and physical bombardment in subsequent processes while maintaining low k-value for target capacitance efficiency.

Some embodiments of the present disclosure provide a method comprising forming a layer using an Atomic Layer Deposition (ALD) process, and annealing the layer in a nitrogen environment. The anneal comprises annealing the layer for a first period of time while increasing an annealing temperature from a first temperature to a second temperature, annealing the layer at the second temperature for a second period of time; and annealing the layer at a third period of time while decreasing annealing temperature from the second temperature.

Some embodiments of the disclosure provide a method comprising forming a layer using an Atomic Layer Deposition (ALD) process, the ALD process comprising, for a cycle of the ALD, flowing a silicon source precursor, flowing a carbon and nitride source precursor, and, flowing an oxygen source precursor. The method further includes annealing the layer to reduce an amount of carbon and an amount of nitrogen in the layer.

Some embodiments of the present disclosure provide a structure comprising an active area on a substrate, the active area comprising a source/drain region, a gate structure over the active area, and a gate spacer along a sidewall of the gate structure, the gate spacer being disposed laterally between the gate structure and the source/drain region, the gate spacer comprising a first spacer layer, and a second spacer layer formed over the first spacer layer, wherein the second spacer layer has a carbon concentration in a range from 0 at. % to 5 at. %, and the second spacer layer has a lower k-value than the first spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   an active area on a substrate, the active area comprising a source/drain region;
   a gate structure over the active area; and
   a gate spacer along a sidewall of the gate structure, the gate spacer being disposed laterally between the gate structure and the source/drain region, the gate spacer comprising:
      a first spacer layer; and
      a second spacer layer formed over the first spacer layer, wherein the second spacer layer has a carbon concentration in a range from 0 atomic percent (at. %) to 5 at. %, wherein a silicon concentration in the second spacer increases as a distance increases from an interface between the first spacer layer and the second spacer layer, wherein an oxygen concentration of the second spacer layer at a sidewall of the second spacer layer opposite the first spacer layer is less than an oxygen concentration of the first spacer layer, and wherein the second spacer layer has a lower k-value than the first spacer layer.

2. The structure of claim 1, wherein the second spacer layer has a density in a range from 2.0 g/cm³ to 3.0 g/cm³.

3. The structure of claim 1, wherein the first spacer layer has a k-value in a range from 5.0 to 7.0.

4. The structure of claim 1, wherein the second spacer layer has a nitrogen concentration in a range from 0 at. % to 15 at. %.

5. The structure of claim 1, wherein the second spacer layer is a silicon oxycarbide nitride film (SiOCN) having a k-value of 4.1.

6. A semiconductor structure comprising:
   a gate structure over a semiconductor substrate; and
   a first gate spacer along a sidewall of the gate structure; and
   a second gate spacer along a sidewall of the first gate spacer, wherein the first gate spacer completely separates the second gate spacer from the gate structure, wherein the second gate spacer has a carbon concentration in a range from 0 atomic percent (at. %) to 5 at. %, wherein an oxygen concentration in the second gate spacer at a sidewall of the second gate spacer distal from the first gate spacer is less than an oxygen concentration in the first gate spacer, and wherein the second gate spacer has a lower k-value than the first gate spacer.

7. The structure of claim 6, wherein the second gate spacer comprises less carbon than the first gate spacer.

8. The structure of claim 6, wherein the second gate spacer comprises nitrogen in a range from about 0 at. % to about 15 at. %.

9. The structure of claim 8, wherein the second gate spacer comprises nitrogen of about 5.3 at. %.

10. The structure of claim 6, wherein the second gate spacer comprises silicon in a range from about 20 at. % to about 40 at. %.

11. The structure of claim 10, wherein a silicon concentration in the second gate spacer at the sidewall of the second gate spacer distal from the first gate spacer is greater than the oxygen concentration in the second gate spacer at the sidewall of the second gate spacer distal from the first gate spacer, and wherein a silicon concentration in the first gate spacer is less than the oxygen concentration in the first gate spacer.

12. The structure of claim 6, wherein the second gate spacer comprises oxygen in a range from about 40 at. % to about 70 at. %.

13. The structure of claim 12, wherein the second gate spacer comprises oxygen of about 65.3 at. %.

14. The structure of claim 6, wherein the second gate spacer has a dielectric constant less than 4.1.

15. The structure of claim 6, wherein the second gate spacer has a density in a range from 2.0 g/cm³ to 3.0 g/cm³.

16. The structure of claim 6, wherein the gate structure comprises a gate dielectric and one or more conductive layers, wherein the gate dielectric completely separates the first gate spacer and the one or more conductive layers, wherein the first gate spacer is interposed between the second gate spacer and the semiconductor substrate.

17. A semiconductor structure comprising:
   a gate structure over a semiconductor substrate; and
   a first gate spacer along a sidewall of the gate structure, wherein the first gate spacer has a carbon concentration in a range from 0 atomic percent (at. %) to 5 at. %, wherein the first gate spacer comprises silicon from about 20 at. % to about 40 at. %, wherein the first gate spacer has a dielectric constant less than 4.1, wherein the first gate spacer comprises nitrogen in a range from about 0 at. % to about 15 at. %, wherein an oxygen concentration in the first gate spacer increases from a sidewall of the first gate spacer closest to the gate structure to a first point within the first gate spacer, and wherein the oxygen concentration in the first gate spacer decreases from the first point within the first gate spacer to a second sidewall of the first gate spacer distal to the gate structure.

18. The structure of claim 17 further comprising a second gate spacer interposed between the first gate spacer and the gate structure.

19. The structure of claim 18, wherein the first gate spacer has a lower dielectric constant than the second gate spacer.

20. The structure of claim 19, wherein the second gate spacer completely separates the first gate spacer from the semiconductor substrate and the gate structure.

* * * * *